US009833780B2

(12) United States Patent
Li et al.

(10) Patent No.: US 9,833,780 B2
(45) Date of Patent: Dec. 5, 2017

(54) MICROFLUIDIC DEVICES FOR THE GENERATION OF NANO-VAPOR BUBBLES AND THEIR METHODS OF MANUFACTURE AND USE

(71) Applicant: University of South Carolina, Columbia, SC (US)

(72) Inventors: Chen Li, Chapin, SC (US); Fanhao Yang, Changsha (CN); Xianming Dai, Wuhan (CN); Yan Tong, Chapin, SC (US)

(73) Assignee: UNIVERSITY OF SOUTH CAROLINA, Columbia, SC (US)

( * ) Notice: Subject to any disclaimer, the term of this patent is extended or adjusted under 35 U.S.C. 154(b) by 0 days.

(21) Appl. No.: 14/830,059

(22) Filed: Aug. 19, 2015

(65) Prior Publication Data
US 2016/0207040 A1    Jul. 21, 2016

Related U.S. Application Data

(62) Division of application No. 13/828,904, filed on Mar. 4, 2013, now Pat. No. 9,139,416.
(Continued)

(51) Int. Cl.
*B81B 1/00*    (2006.01)
*C23F 1/00*    (2006.01)
(Continued)

(52) U.S. Cl.
CPC ..... *B01L 3/502707* (2013.01); *B01J 19/0093* (2013.01); *B01L 3/502715* (2013.01); *B81B 1/00* (2013.01); *B81B 7/0087* (2013.01); *B81C 1/00031* (2013.01); *B81C 1/00111* (2013.01); *B81C 1/00119* (2013.01);
(Continued)

(58) Field of Classification Search
None
See application file for complete search history.

(56) References Cited

U.S. PATENT DOCUMENTS

| | | | |
|---|---|---|---|
| 7,208,094 B2 * | 4/2007 | Islam | B82Y 10/00 117/2 |
| 7,290,667 B1 | 11/2007 | Bakajin et al. | |

(Continued)

FOREIGN PATENT DOCUMENTS

| | | | |
|---|---|---|---|
| EP | 1 696 473 A2 * | 8/2006 | |
| KR | 101087267 B1 * | 11/2011 | |

OTHER PUBLICATIONS

Huang et al (Low-Cost, Large-Scale, and Facile Production of Si Nanowires Exhibiting Enhanced Third-Order Optical Nonlinearity; ACS Appl. Mater. Interfaces 2012, 4, 1553-1559.*
(Continued)

*Primary Examiner* — Shamim Ahmed
(74) *Attorney, Agent, or Firm* — Dority & Manning, P.A.

(57) ABSTRACT

Microfluidic devices having superhydrophilic bi-porous interfaces are provided, along with their methods of formation. The device can include a substrate defining a microchannel formed between a pair of side walls and a bottom surface and a plurality of nanowires extending from each of the side walls and the bottom surface. For example, the nanowires can be silicon nanowires (e.g., pure silicon, silicon oxide, silicon carbide, etc., or mixtures thereof).

19 Claims, 6 Drawing Sheets

Related U.S. Application Data

(60) Provisional application No. 61/742,008, filed on Mar. 1, 2012, provisional application No. 61/742,007, filed on Mar. 1, 2012.

(51) Int. Cl.
| | |
|---|---|
| B01J 19/00 | (2006.01) |
| B01L 3/00 | (2006.01) |
| B81C 1/00 | (2006.01) |
| B81B 7/00 | (2006.01) |

(52) U.S. Cl.
CPC ... *B81C 1/00206* (2013.01); *B01J 2219/0086* (2013.01); *B01J 2219/00783* (2013.01); *B01J 2219/00828* (2013.01); *B01J 2219/00835* (2013.01); *B01J 2219/00846* (2013.01); *B01L 2200/12* (2013.01); *B01L 2300/0858* (2013.01); *B01L 2300/12* (2013.01); *B81B 2201/058* (2013.01); *B81B 2203/033* (2013.01); *B81B 2203/0361* (2013.01); *B81C 2201/014* (2013.01); *Y10T 137/0318* (2015.04); *Y10T 428/24496* (2015.01)

(56) References Cited

U.S. PATENT DOCUMENTS

| | | | | |
|---|---|---|---|---|
| 7,757,371 | B2* | 7/2010 | Liu | B82Y 15/00 264/221 |
| 2003/0062149 | A1 | 4/2003 | Goodson et al. | |
| 2005/0233585 | A1* | 10/2005 | Lai | B01J 23/74 438/678 |
| 2006/0009354 | A1* | 1/2006 | Yeung | B01D 53/864 502/344 |
| 2006/0182966 | A1* | 8/2006 | Lee | B82Y 30/00 428/375 |
| 2007/0090489 | A1 | 4/2007 | Hart et al. | |
| 2008/0293175 | A1* | 11/2008 | Torii | B82Y 10/00 438/30 |
| 2009/0072222 | A1* | 3/2009 | Radisic | B01J 23/75 257/24 |
| 2009/0084496 | A1 | 4/2009 | Fonverne et al. | |
| 2010/0029063 | A1* | 2/2010 | Gambin | B82Y 10/00 438/478 |
| 2010/0048380 | A1* | 2/2010 | Calabrese Barton | H01M 4/881 502/5 |
| 2010/0314617 | A1* | 12/2010 | Ito | B81C 1/00111 257/43 |
| 2012/0000691 | A1* | 1/2012 | Shah | B82Y 30/00 174/102 R |
| 2012/0080678 | A1* | 4/2012 | Kim | B82Y 10/00 257/57 |
| 2012/0090816 | A1 | 4/2012 | Bayazitoglu et al. | |
| 2013/0122717 | A1* | 5/2013 | Green | C09K 13/08 438/753 |
| 2013/0337236 | A1* | 12/2013 | Cott | B82Y 10/00 428/173 |

OTHER PUBLICATIONS

B.S. Kim et al., "Micro-nano hybrid structures with manipulated wettability using a two-step silicon etching on a large area," Nanoscale Research Lett. 6: 333, 1-10, 2011.
Royne et al.,"Cooling of photovoltaic cells under concentrated illumination: a critical review", Solar Energy Materials & Solar Cells 86 (2005) 451-483.
McGlen et al., "Integrated therman management techniques for high power electronic devices", Applied Therman Engineering 24 (2004) 1143-1156.
Luo et al., "A Microjet Array Cooling System for Therman Management of High-Brightness LEDs", IEEE Transactions on Advanced Packaging, vol. 30, No. 3, Aug. 2007, 475-484.
Jense, Klavs F., "Microreaction engineering—is smaller better?", Chemical Engineering Science 56 (2001) 293-303.
Losey et al., "Design and Fabrication of Microfluidic Devices for Multiphase Mixing and Reaction", Journal of Microelectromechanical Systems, vol. 11, No. 6. Dec. 2002, 709-717.
Kobayashi et al., "A Microfluidic Device for Conducting Gas-Liquid-Solid Hydrogenation Reactions", Science vol. 304, May 28, 2014, 1305-1308.
Shui et al., "Multiphase flow in lab on chip devices: A real tool for the future?", Lab Chip, 2008, 8, 1010-1014.
Hartman et al., "Microchemical systems for continuous-flow synthesis", Lab Chip, 2009, 9, 2495-2507.
Yue et al., "Hydrodynamics and mass transfer characteristics in gas-liquid flow through a rectangular microchannel", Chemical Engineering Science 62 (2007) 2096-2108.
Thome, John R., "Boilng in microchannels: a review of experiment and theory", International Journal of Heat and Fluid Flow 25 (2004) 128-139.
Thome, John R. "State-of-the-Art Overview of Boiling and Two-Phase Flows in Microchannels", Heat Transfer Engineering 27 (9) 2006, 4-19.
Agostini et al., "State of the Art of High Heat Flux Cooling Technologies", Heat Transfer Engineering 28 (4) 2007, 258-281.
Cheng et al., "Recent Work on Boiling and Condensation in Microchannels" Journal of Heat Transfer, vol. 131, Apr. 2009, 043211-15.
Kandlikar et al., "Stabilization of Flow Boiling in Microchannels Using Pressure Drop Elements and Fabricated Nucleation Sites", Journal of Heat Transfer, vol. 128, Apr. 2006, 389-396.
Zhang et al., "Ledinegg instability in microchannels", International Journal of Heat and Mass Transfer 52 (2009) 5661-5674.
Zhang et al., "Two-phase refrigerant flow instability analysis and active control in transient electronics cooling system", International Journal of Multiphase Flow 37 (2011) 84-97.
Wang et al., "Effects of inlet/outlet configurations on flow boiling instability in parallel microchannels", International Journal of Heat and Mass Transfer 51 (2008) 2267-2281.
Wojtan et al., "Investigation of saturated critical heat flux in a single, uniformly heated microchannel", Experimental Thermal and Fluid Science 30 (2006) 765-774.
Kuo et al., "Flow Boiling Instabilities in Microchannels and Means for Mitigation by Reentrant Cavities", Journal of Heat Transfer, vol. 130, Jul. 2008, 072402-1-10.
Kuo et al., "Pressure effects on flow boiling instabilities in parallel microchannels", International Journal of Heat and Mass Transfer 52 (2009) 271-280.
Vafaei et al., "Critical Heat Flux (CHF) of Subcooled Flow Boiling of Alumina Nanofluids in a Horizontal Microchannel", Journal of Heat Transfer, vol. 132, Oct. 2010, 102404-1-7.
Hsieh et al., "Correlation of critical heat flux and two-phase friction factor for subcooled convective boiling in structures surface microchannels", International Journal of Heat and Mass Transfer 55 (2012) 32-42.
Cao et al., "Experiment Investigation of R134a Flow Boiling Process in Microchannel with Cavitation Structure", Heat Transfer Engineering 32 (7-8), 2001, 542-553.
Kubo et al., "Effects of Size and Number Density of Micro-reentrant Cavities on Boiling Heat Transfer from a Silicon Chip Immersed in Degassed and Gas-dissolved FC-72", Enhanced Heat Transfer, vol. 6, 1999, 151-160.
Wang et al., "Enhanced Boiling Heat Transfer in Parallel Microchannels with Diffusion Brazed Wire Mesh", IEEE Transaction on Components and Packaging Technologies, vol. 33, No. 4, Dec. 2010, 784-793.
Morshed et al., "Enhanced flow boiling in microchannel with integration of nanowires", Applied Therman Engineering 32 (2012) 68-75.
Singh et al., "Flow boiling enhancement on a horizontal heater using carbon nanotube coatings", International Journal of Heat and Fluid Flow 31 (2010) 201-207.
Krishnamurthy et al., "Flow Boiling Heat Transfer on Micro Pin Fins Entrenched in a Microchannel", Journal of Heat Transfer, vol. 132, Apr. 2010, 041007-1-10.

(56) References Cited

OTHER PUBLICATIONS

Guo et al., "Enhanced flow boiling heat transfer with jet impingement on micro-pin-finned surfaces", Applied Thermal Engineering 31 (2011) 2042-2051.
Teichert et al., "Comparison of surface roughness of polished silicon wafers measured by light scattering topography, soft-x-ray scattering, and atomic-force microscopy", Appl. Phys. Lett. 66 (18), May 1, 1995, 2346-2348.
Li et al., "Dynamic characteristics of transient boiling on a square platinum microheater under millisecond pulsed heating", International Journal of Heat and Mass Transfer 51 (2008) 273-282.
Chen et al., "Nanowires for Enhanced Boiling Heat Tranfser", Nano Letters, vol. 9, No. 2, 2009, 548-553.
Li et al., "Nanostructured Copper Interfaces for Enhanced Boiling", Small, 4, No. 8, 2008, 1084-1088.
Khanikar et al., "Effects of carbon nanotube coating on flow boiling in a micro-channel", International Journal of Heat and Mass Transfer 52 (2009) 3805-3817.
Ujereh et al., "Effects of carbon nanotube arrays on nucleate pool boiling", International Journal of Heat and Mass Transfer 50 (2007) 4023-4038.
Khanikar et al., "Flow Boiling in a Micro-Channel Coated with Carbon Nanotubes", IEEE Transactions on Components and Packaging Technologies, vol. 32, No. 3, Sep. 2009, 639-649.
Liu et al., "Boiling flow characteristics in microchannels with very hydrophobic surface to super-hydrophilic surface", International Journal of Heat and Mass Transfer 54 (2011) 126-134.
Serizawa et al., "Two-phase flow in microchannels", Experimental Thermal and Fluid Science 26 (2002) 703-714.
Harirchian et al., "Boiling Heat Transfer and Flow Regimes in Microchannels—A Comprehensive Understanding", Journal of Electronic Packaging vol. 133, Mar. 2011, 011001-1-10.
Yang et al., High frequency microbubble-switched oscillations modulated by microfluidic transistors, Applied Physics Letters 101, 2012, 073509-1-4.
Borkent et al., "Superstability of Surface Nanobubbles", Phys. Rev. Lett.98, 20, 2007, 204502-1-4.
Jin et al., "Direct measurement of the nanobubble-induced weak depletion attraction between a spherical particle and a flat surface in an aqueous solution", Soft Matter, 4, 2008, 968-971.
Li et al., "Nature-Inspired Boiling Enhancement by Novel Nanostructured Macroporous Surfaces", Adv. Funct. Mater. 18, 2008, 2215-2220.
Peng et al., "Synthesis of Large-Area Silicon Nanowire Arrays via Self-Assembling Nanoelectrochemistry", Adv. Mater. 14, No. 16, 2002, 1164-1167.
Zhang et al., "Preparation of Large-Area Uniform Silicon Nanowires Arrays through Metal-Assisted Chemical Etching", J. Phys. Chem. C 112, 2008, 4444-4450.
Fan et al., "Nanocarpet Effect: Pattern Formation during the Wetting of Vertically Aligned Nanorod Arrays", Nano Letters, vol. 4, No. 11, 2133-2138.
Hsu, Y.Y., "On the Size Range of Active Nucleation Cavities on a Heating Surface", Journal of Heat Transfer, vol. 84, Aug. 1962, 207-216.
Rovinsky et al., "Analytical Solution for Laminar Two-Phase Flow in a Fully Eccentric Core-Annular Configuration", Int. J. Multiphase Flow, vol. 23, No. 3, 1997, 523-543.
Kuo et al., "Bubble Dynamics During Boiling in Enhanced Surface Microchannels", Journal of Microelectrochemical Systems, vol. 15, No. 6, Dec. 2006, 1514-1527.
Piasecka et al., "Experimental evaluation of flow boiling incipience of subcooled fluid in a narrow channel", International Journal of Heat and Fluid Flow 25 (2004) 159-172.

Thorncroft et al., "Bubble Forces and Detachment Models", Multiphase Science and Technology, vol. 13 Nos. 3 &4, 2001, p. 35-76.
Mikic et al., "On Bubble Growth Rates", Int. J. Heat Mass Transf. vol. 13, 1970, 657-666.
Choi et al., "Surface wettability effect on flow pattern and pressure drop in adiabatic two-phasae flows in rectangular michrochannels with T-junction mixer", Experimental Thermal and Fluid Science 35 (2011) 1086-1096.
Raven et al., "Periodic Microfluidic Bubbling Oscillator: Insight into the Stability of Two-Phase Microflows", Phys. Rev. Lett. 97, 2006, 154501-1-4.
Marmottant et al., "Microfluidics with foams", Soft Matter, 5, 2009, 3385-3388.
Rabaud et al., "Manipulation of confined bubbles in a thing microchannel: Drag and acoustic Bjerknes forces", Physics of Fluids 23, 2011, 042003-1-9.
Okamoto et al., "Microarray fabrication with covalent attachment of DNA using Bubble Jet technoiogy", Nature Biotechnology, vol. 18, Apr. 2000, 438-441.
Maxwell et al., "A Microbubble-Powered Bioparticle Actuator", Journal of Microelectromechanical Systems, vol. 12, No. 5, Oct. 2003. 630-640.
Bergles et al., "On the Nature of Critical Heat Flux in Microchannels", Journal of Heat Transfer, vol. 127, Jan. 2005, 101-107.
Kashid et al., "Gas-liquid and liquid-liquid mass transfer in microstructured reactors", Chemical Engineering Science 66 (2011) 3876-3897.
Kandlikar, Satish G., "Scale effects on flow boiling heat transfer in microchannels: A fundamental perspective", International Journal of Thermal Sciences 49 (2010) 1073-1085.
Agarwal et al, "Principle and applications of microbubble and nanobubble technology for water treatment", Chemosphere 84 (2011) 1175-1180.
Wu et al., "Cleaning using nanobubbles; Defouling by electrochemical generation of bubbles", Journal of Colloid and Interface Science 328 (2008) 10-14.
Lukianova-Hleb et al., "Plasmonic Nanobubbles as Transient Vapor Nanobubbles Generated around Plasmonic Nanoparticles", ACS Nano, vol. 4, No. 4, 2010, 2109-2123.
Hernot et al., "Microbubbles in ultrasound-triggered drug and gene delivery", Advanced Drug Delivery Reviews 60 (2008) 1153-1166.
Kuo et al., "Control of Superhydrophilicity and Superhydrophobicity of a Superwetting Silicon Nanowire Surface", Journal of the Electrochemical Society 157, 9 (2010) K210-K205.
Street et al., "Reflectivity of disordered silicon nanowires", Appl. Phys. Lett. 93 (2008) 163109-1-3.
Zimmerman et al., "Towards energy efficient nanobubble generation with fluidic oscillation", Current Opinion in Colloid & Interface Science 16 (2011) 350-356.
Koishi et al., Nanoscale Hydrophobic Interaction and Nanobubble Nucleation, Phys. Rev. Lett. 93, No. 18, Oct. 29, 2004, 185701-1-4.
Ceccio, Steven L., "Friction Drag Reduction of External Flows with Bubble and Gas Injection", Annu. Rev. Fluid Mech. 42, 2010, 183-203.
Vakarelski et al., "Drag Reduction by Leidenfrost Vapor Layers", Phys. Rev. Lett. 106 (2011) 214501-1-4.
Tsai et al., "Boundary Layer Mixture Model for a Microbubble Drag Reduction Technique", ISRN Mechanical Engineering vol. 2011 (2011), 405701, 9 pages.
Wu et al., "Visualization and measurements of periodic boiling in silicon microchannels", International Journal of Heat and Mass Transfer 46 (2003) 2603-2614.
Holmberg et al., "Nanobubble Trouble on Gold Surfaces", Langmuir 19 (2003), 10510-10513.

\* cited by examiner

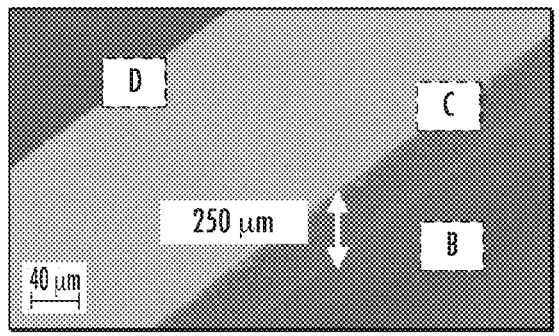 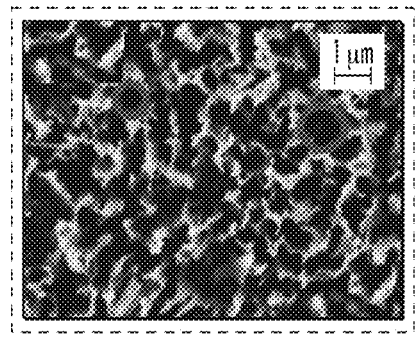
FIG. 1A                          FIG. 1B
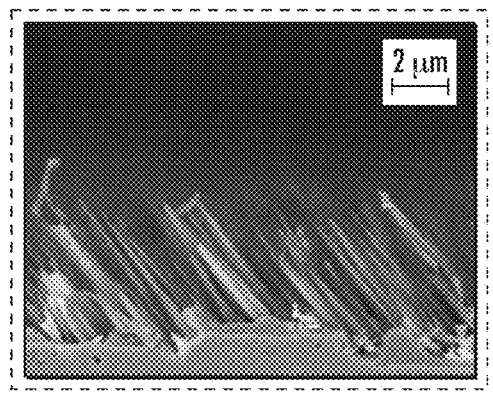 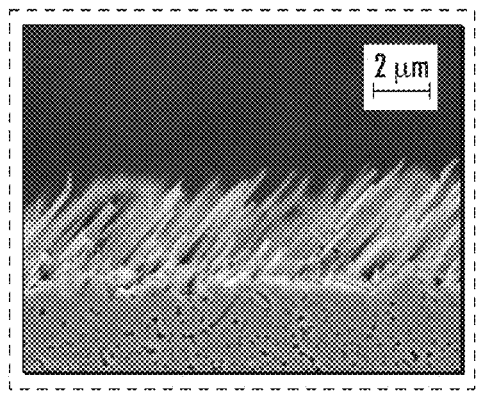
FIG. 1C                          FIG. 1D

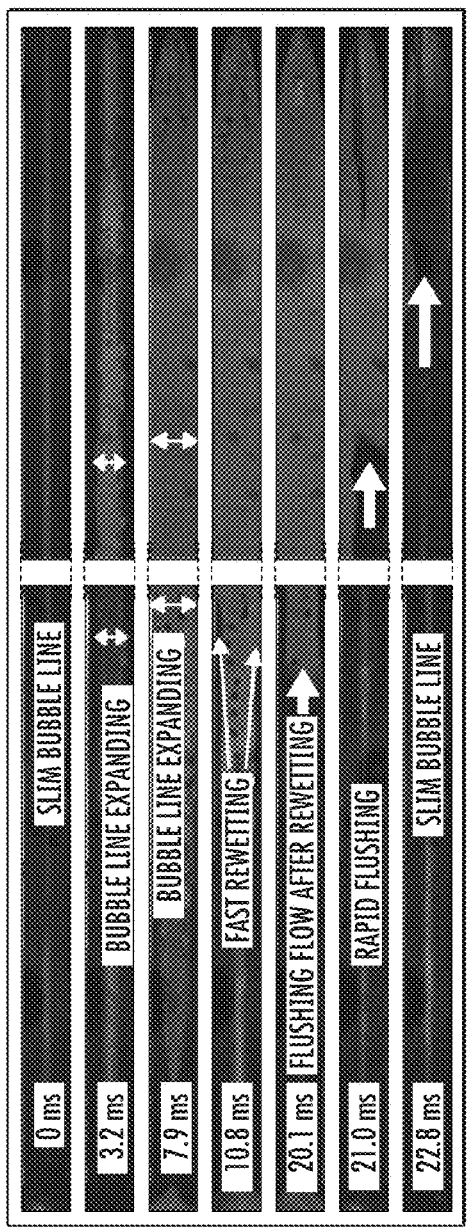
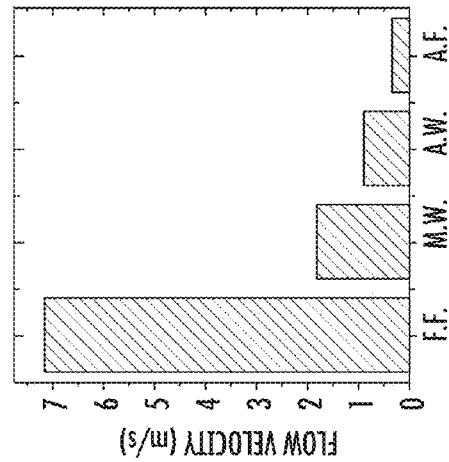
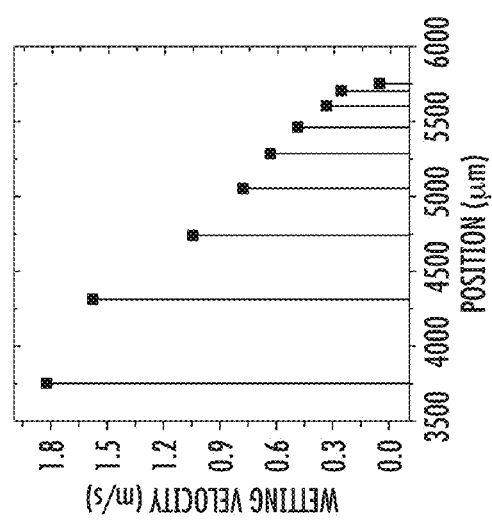
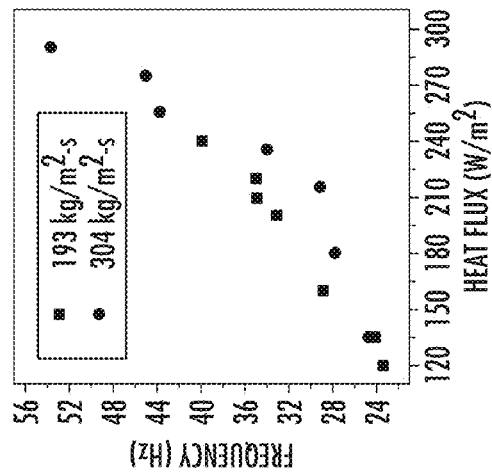
FIG. 3A
FIG. 3B
FIG. 3C
FIG. 3D

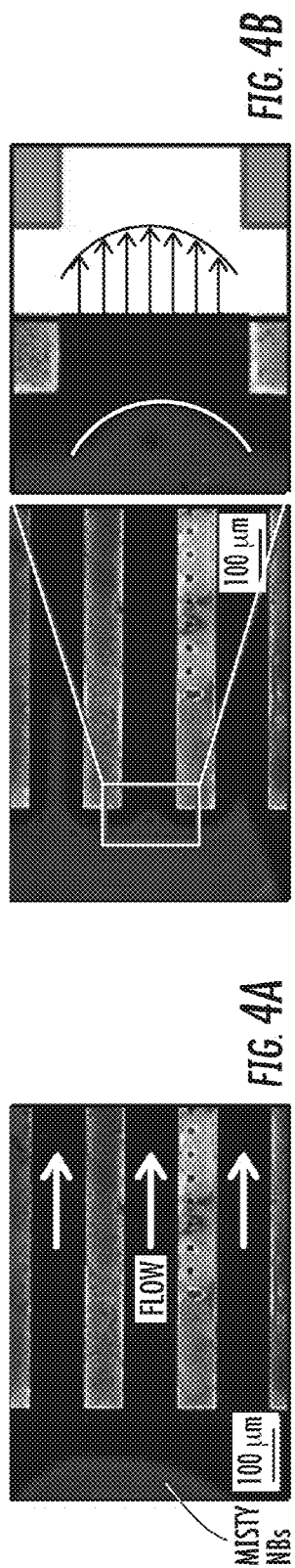
FIG. 4A
FIG. 4B
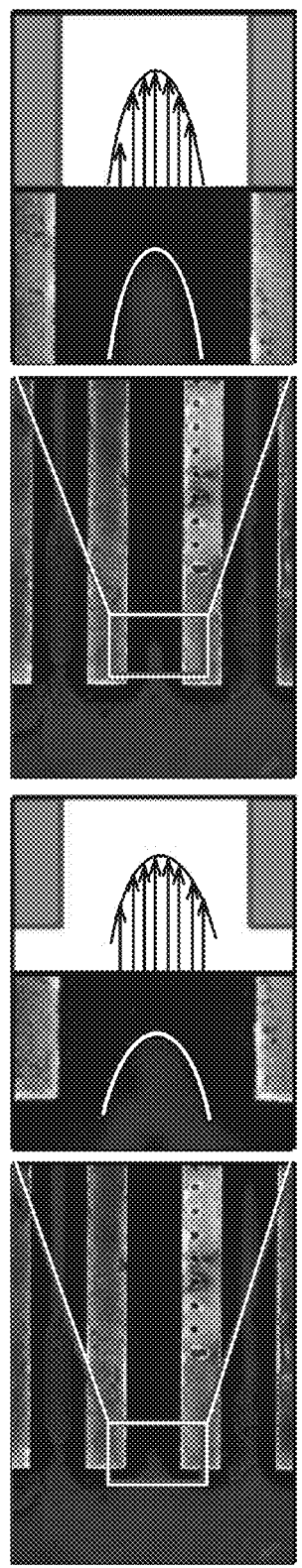
FIG. 4C
FIG. 4D
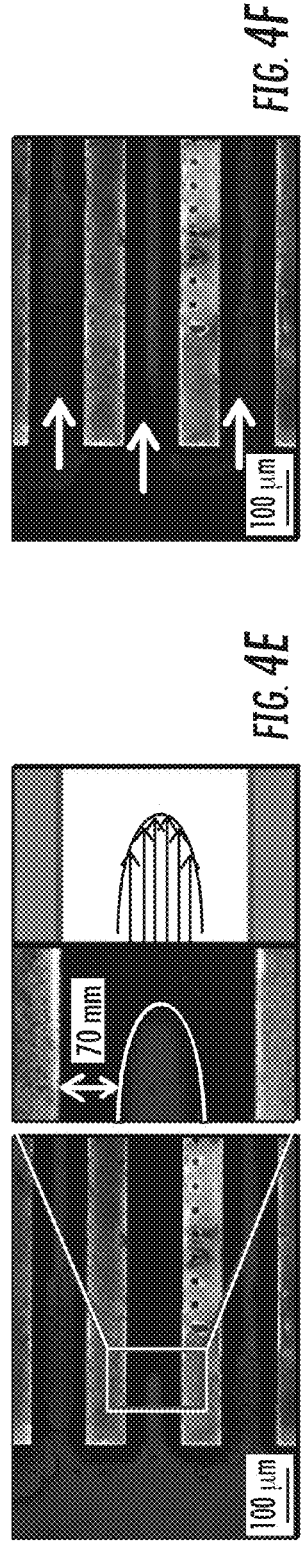
FIG. 4E
FIG. 4F

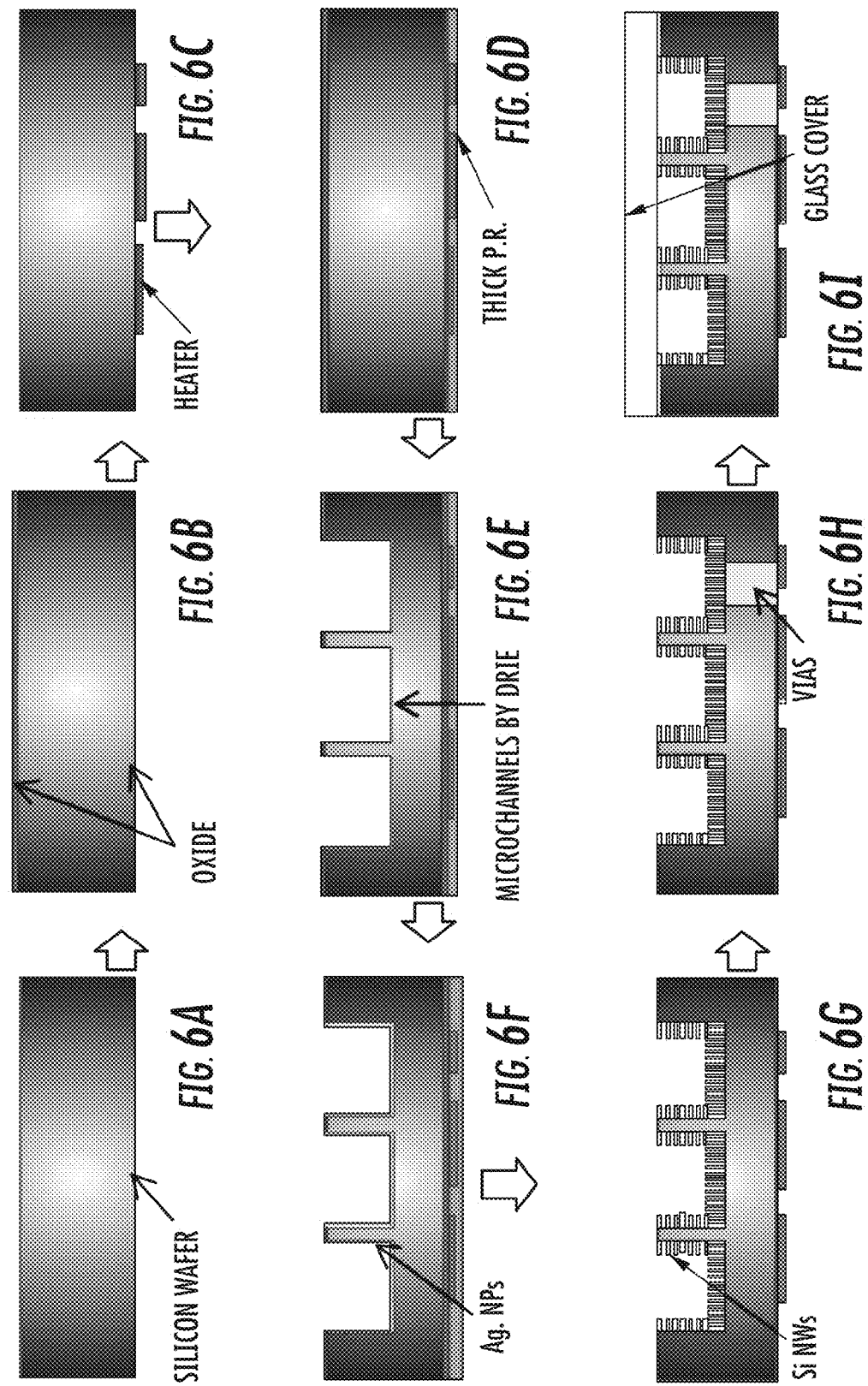

MICROFLUIDIC DEVICES FOR THE GENERATION OF NANO-VAPOR BUBBLES AND THEIR METHODS OF MANUFACTURE AND USE

PRIORITY INFORMATION

The present application claims priority to and is a divisional application of U.S. patent application Ser. No. 13/828,904 titled "Microfluidic Devices for the Generation of Nano-vapor Bubbles and Their Methods of Manufacture and Use" of Li, et al., filed on Mar. 14, 2013, which claims priority to U.S. Provisional Patent Application Ser. No. 61/742,008 titled "Generation of Nanovapor Bubbles" of Li, et al. filed on Aug. 1, 2012, and to U.S. Provisional Patent Application Ser. No. 61/742,007 titled "Ultra-Efficient Flow Boiling Enabled by Nanoengineered Bi-Porous Interfaces" of Li, et al. filed on Aug. 1, 2012, the disclosures of which are incorporated by reference herein.

BACKGROUND

Efficient flow boiling in miniaturized systems is highly demanded due to its promise in developing high heat flux thermal management technologies for high power electronic and electric devices. In addition, micro- and nano-scale bio and chemical reactors can reach ultra-high efficiency by taking advantage of enhanced mass and heat transfer in miniaturized systems. Flow boiling in miniaturized channels has been extensively studied in the last decade.

The advances in nanofabrication and the demand of ultra-compact electronics and bio/chemical reactors have imposed extreme challenges in transporting ultrahigh heat fluxes. In theory, flow boiling in microchannels can achieve high heat and mass transport efficiency due to the high surface-area-to-volume ratio and the latent heat transport. However, in practice, the flow boiling in microchannels is limited by the viscous dominant flow and unpredicted flow pattern transitions, which result in pronounced instabilities and hence low heat and mass transfer efficiency.

Two-phase transport in microfluidic systems has attracted increasing attentions because of its wide range of application fields varying from biology to chemistry to energy and thermal management. The classic two-phase flow patterns in microchannels, which primarily include bubbly flow, slug flow, churn flow and annular flow, are diversified. However, classic two-phase flow patterns are diversified and show unpredictable transitions.

The nature of unpredictable two-phase flow pattern transitions in conventional microchannels could hinder the performance of two-phase transport and cause pronounced two-phase flow instabilities. In microfluidic systems, the formations of two-phase flow patterns are primarily governed by bubble confinements, liquid and vapor interactions, and internal governing forces.

SUMMARY

Objects and advantages of the invention will be set forth in part in the following description, or may be obvious from the description, or may be learned through practice of the invention.

Microfluidic devices are generally provided having superhydrophilic bi-porous interfaces. The device includes, in one embodiment, a substrate defining a microchannel formed between a pair of side walls and a bottom surface; and a plurality of nanowires extending from each of the side walls and the bottom surface. For example, the nanowires can be silicon nanowires (e.g., pure silicon, silicon oxide, silicon carbide, etc., or mixtures thereof).

Methods are also generally provided for forming a microfluidic device from a silicon wafer that defines a first surface opposite from a second surface. In one embodiment, an oxide layer is deposited on the first surface; a microchannel is formed in the first surface of the silicon wafer to be defined between a pair of side walls and a bottom surface; a layer of Ag+ nanoparticles on each side wall and the bottom surface; and a plurality of silicon nanowires are formed extending from each side wall and the bottom surface.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures.

FIGS. 1(a)-1(d) show nano-engineered interfaces systhesized from superhydrophilic silicon nanowires on inner walls of a microchannel according to Example 1, with FIG. 1(a) showing a scanning electron microscope (SEM) image shows the coverage of superhydrophilic silicon nanowires in a rectangle microchannel with a cross section of 200 µm wide by 250 µm high.

FIG. 1(b) shows the top-viewed SEM image of superhydrophilic silicon nanowires on the bottom surface. Nanowire bundles are formed by neighboring nanowires as a result of nanocarpet effect during the wet etching process. Consequently, a large amount of evenly distributed and interconnected pores with diameters ranging from about 10 nanometers (nm) to about 3 micrometers (µm) are successfully created by nanowires.

FIGS. 1(c) and 1(d) show SEM images of superhydrophilic silicon nanowires on top edge of vertical walls. Because of the crystal orientation, approximately 5 µm long nanowire arrays with various tilted angles are formed in inner surfaces of a microchannel as shown in 1(b), 1(c) and 1(d), where the nanowires on two side walls have approximately 45° tilt angles and those on the bottom surface are nearly vertical.

FIGS. 2(a) and 2(b) show a schematic of bubble distributions in a microchannel with smooth walls and nano-engineered walls, respectively. FIGS. 2(c), 2(e), and 2(g) are images of vapor bubble size and density in nano-engineered microchannels at heat fluxes of 25, 100, 225 W/cm$^2$ with corresponding mass fluxes of 50, 248 and 404 kg/m$^2$·s, respectively. FIGS. 2(d), 2(f), and 2(h) are magnified images to estimate vapor bubble size and density. Arrows indicate flow directions.

FIG. 3 shows a visualization study of generation of the annular NB flow during convective boiling in microchannels with superhydrophilic nano-engineered interfaces in a typical cycle. All images were taken from the top-view. FIG. 3(a) shows a whole period of the annular NB flow in a microchannel during convective boiling. FIG. 3(b) shows rewetting frequency as a function of input heat flux. FIG. 3(c) shows rewetting velocity profile during a rapid and periodic rewetting process. FIG. 3(d) shows the typical velocities during rewetting process. F.F., M.W., A.W., and A.F. stand for the velocities of Fast Flushing, Maximum Wetting, Average Wetting, and Average two-phase Flow at inlet, respectively. Images in FIG. 3(a) were captured by a visualization system consisting of a high-speed camera and an optical microscope under the conditions: G=193 kg/m²·s, $\chi$=0.4. The white/gray areas denote vapor bubbles and black/dark areas stand for liquid or droplets. Dash lines between two sets of images denote continuous channels.

FIGS. 4(a) to 4(f) are a visulization study of continously tranportion of vapor NB flow within saturated water through a nano-engineered microchannel array. The front ends of NB flow are magnified. Velocity profile of vapor NB flow are sketched by arrows. This interface between NB flow and liquid layer are highlighted by white curves. The average mass flux of this observation is 449 kg/m²·s. The average front velocity of NBs flow is 0.445 m/s.

FIGS. 6(a)-6(i) schematically show a method of an exemplary microfabrication processes.

DETAILED DESCRIPTION

Figure 2A:
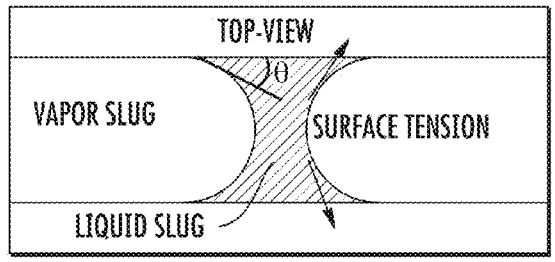
FIGS. 2(a)-2(h) show comparisons of bubble generation and flow in microchannels with smooth walls and with the nano-engineered walls of Example 1.
Figure 2C:
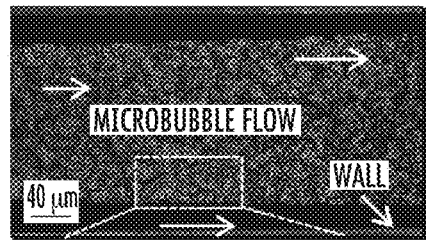
Figure 2B:
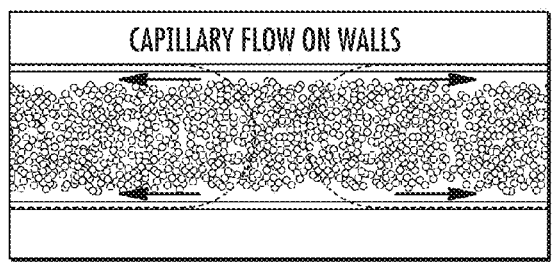
Figure 2D:
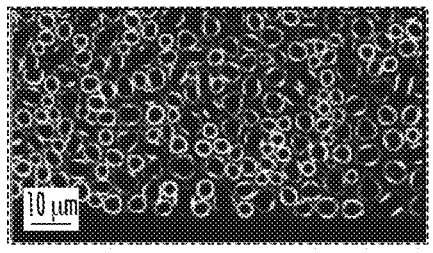
Figure 2E:
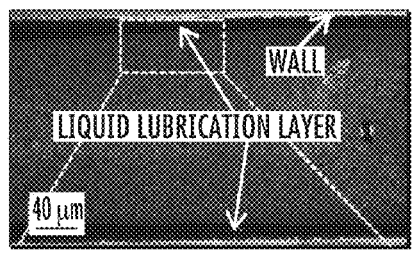
Figure 2G:
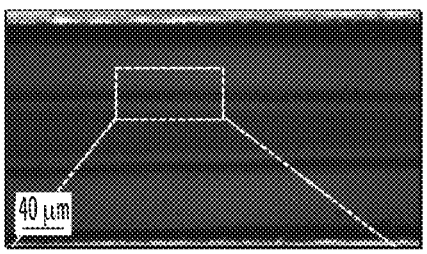
Figure 2F:
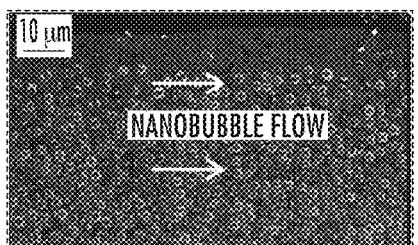
Figure 2H:
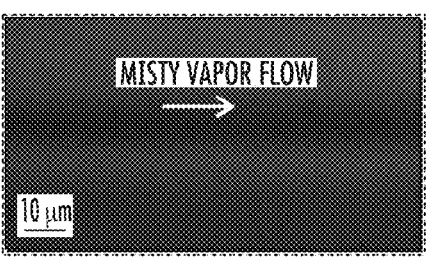

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

Generally speaking, the present disclosure is directed to nano-engineered superhydrophilic bi-porous interfaces within microchannels that can generate large amount of stable and isolated vapor NBs. Thus, the diversified two-phase flow patterns in microfluidic systems can be unified. The intrinsic merits of a unified two-phase flow pattern are highly desired by all areas pertinent to microscale two-phase transport.

Referring to FIG. 6(g), a microfluidic device with superhydrophilic bi-porous interfaces is generally represented that includes a substrate (e.g., a silicon wafer) defining a microchannel formed between a pair of side walls and a bottom surface. A plurality of nanowires (NWs) extend from each of the side walls and the bottom surface. Although discussed below with respect to nanowires comprising silicon (e.g., pure silicon, silicon oxide, silicon carbide, etc.), any suitable material capable of forming nanowires can be utilized to form the nanowires, including but not limited to including metallic nanowires (e.g., Ni, Pt, Au), semiconducting nanowires (e.g., Si, InP, GaN, SiC, etc.), insulating nanowires (e.g., $SiO_2$, $TiO_2$), carbon nanowires, etc., or mixtures thereof.

As shown, the microchannel is substantially rectangular in that each of the side walls is substantially perpendicular to the bottom surface (i.e., forming about a 90° angle with the bottom surface). Thus, the microchannel is substantially rectangular in that each of the side walls is substantially perpendicular to the bottom surface. However, in other embodiments, each of the side walls may be slightly angled from perpendicular to the bottom surface (e.g., forming about a 85° angle to about a 95° with the bottom surface).

In one particular embodiment, the microchannel has dimensions in the micrometer scale. For example, the microchannel can have a depth of about 50 µm to about 1000 µm (e.g., about 100 µm to about 500 µm). Similarly, the microchannel can have a width of about 50 µm to about 1000 µm (e.g., about 100 µm to about 500 µm).

As stated, the silicon nanowires extend from each of the internal surfaces within the microchannel (i.e., extend from both side walls and the bottom surface). The silicon nanowires are generally formed from a silicon material, such as pure silicon, silicon oxide, silicon carbide, etc. For example, the silicon nanowires can be formed in hydrofluoric acid with Ag+ nanoparticles present as a catalyst. In one embodiment, such as described in method schematically shown by FIGS. 6(a)-6(i), a layer of Ag+ nanoparticles is deposited followed by growth of the silicon nanowires in hydrofluoric acid on the Ag+ nanoparticles layer serving as a catalyst. For example, the layer of Ag+ nanoparticles can be deposited by stirring a solution/dispersion/suspension within the microchannel such that the nanoparticles are deposited on the layer. The thickness of the layer can be increased, in one embodiment, by the length of stirring. Additional deposition methods could also be utilized (e.g., sputtering, CVD, etc.).

Neighboring silicon nanowires generally form bundles (e.g., due to their proximity to each other) on the surfaces of the microchannel such that a plurality of interconnected pores are created on the side walls and bottom surface. For example, the interconnected pores can have a diameter of about 10 nm to about 3 µm.

In one embodiment, the silicon nanowires extending from the bottom surface are substantially perpendicular to the bottom surface. In contrast, the silicon nanowires extending from each of the side walls can be angled in relation to its respective side surface and to the bottom surface. For example, the silicon nanowires extending from each of the side walls can have a tilt angle of about 30° to about 60° in relation to the bottom surface (e.g., approximately 45° tilt angles in relation to the bottom surface, in one particular embodiment).

After formation, the nanowires can be oxidized to achieve increased hydrophilicity. For example, when constructed from silicon (e.g., pure silicon), the silicon nanowires can be oxidized to form a superhydrophilic silicon nanowire (e.g., having a contact angle that is less than about 5°, such as about 0° to about 3°).

Example 1

It was experimentally demonstrated that the diversified two-phase flow patterns can be unified into a singular two-phase flow pattern termed annular nanobubble flow in nano-engineered microchannels. The interfaces coated on all inner walls of microchannels were synthesized from superhydrophilic silicon nanowires. The new and unified two-phase flow pattern was realized by reducing bubble size down to 5 µm and less through sophisticatedly controlling bubble separation processes as well as by transforming the dominant surface tension force from the cross-section plane to the inner-wall plane. In order to produce stable and isolated vapor nanobubbles (NBs) during nucleate boiling and transforming surface tension forces, microscale pores surrounded by nanoscale pores were created by controlling the height of silicon nanowires through the use of nanocarpet effect. Self-stable two-phase flow under the new two-phase flow pattern has been observed in this experimental study.

In this study, it is reported that these three important factors can be controlled through sophisticatedly designed superhydrophilic nano-engineered interfaces. The interfaces synthesized from silicon nanowires (approximately 20 nm in diameter and 5 µm long) were directly grown on the bottom and the side walls of microchannels with 220 µm in hydraulic diameter (FIGS. 1a and 1b). This type of nano-engineered interfaces was carefully designed with aim at producing stable and isolated vapor NBs and transforming the dominant surface tension force from the cross-section plane to inner-wall plane. A mechanism to regulate bubble nucleation, separation, and two-phase flows has been formulated. The classic diversified two-phase flow patterns were experimentally demonstrated to be unified into a singular two-phase flow pattern termed annular vapor nanobubble flow. The unified annular vapor nanobubble flow, which can radically prevent two-phase flow pattern transitions, has been experimentally demonstrated to be self-stabilized. Equally important, large amount of generation of stable and isolated vapor NB with extremely high surface area to volume ratio (about $10^6$ $m^{-1}$) could be a critical enabler to broad emerging nanotechnologies from environment to biotechnology and thermal management.

In this experimental study, based on nucleate boiling theory and previous work, nanostructured interfaces with micropores (formed from nanowire bundles) surrounded by nanoscale pores (created by isolated nanowires) as illustrated in FIG. 1b were created from silicon nanowires by the nanocarpet effect. Except for the top surface of the microchannel array covered by Pyrex glass as an observation window, all inner walls in the microchannels (FIGS. 1a, 1c and 1d) were coated by the superhydrophilic silicon nanowires. The silicon nanowires were oxidized to achieve superhydrophilicity (approximately 0° contact angle). Bubble are nucleated and departed on the nano-engineered interfaces during boiling. The bubble size was reduced to be less than about 5 µm. Bubbles less than 5 µm are termed NBs in this work. According to classic thermodynamics equilibrium theory, vapor NBs are not stable. Although the existence and stability of gas NBs have been experimentally demonstrated, the existence of stable and isolated vapor NBs has not been reported. In this study, during a well-controlled convective boiling process, stable and isolated vapor NBs have been observed in a microchannel array, which was comprised of five parallel microchannels (length, width and depth are 10 mm, 200 µm and 250 µm) as shown in FIGS. 2 and 3. The vapor NBs were transported in a unified NB annular flow in the nano-engineered microchannel array as illustrated in FIG. 4.

Several important experimental results and observations are summarized.

First, bubble confinements have been observed to completely disappear when stable and isolated vapor NBs were generated in microchannels as illustrated FIGS. 1a to 1h. This set of figures demonstrated that isolated NBs appear to be well dispersed with extremely high density (e.g., more than $1.4 \times 10^7$ bubbles per $cm^2$ at heat flux of 100 $W/cm^2$) and high surface area to volume ratio (about $6 \times 10^6$ $m^{-1}$). These figures also showed that the bubble size was reduced to be less than 5 µm (FIGS. 1c and 1d). The smallest bubble size that could be captured by the microscope is approximately 500 nm (FIGS. 1e and 1f). The bubble size decreases with the increasing input heat flux and mass flux. The bubbles can only be measured near the observation window by an optical microscope because of the significantly reduced reflectivity on silicon nanowires near the bottom walls. When heat flux is higher than 225 $W/cm^2$ (FIGS. 1g and 1h), the boundary of an individual NB cannot be clearly identified due to the resolution limitation of the optical microscope. The observed misty flows implied that the bubble size with the heat flux exceeding 225 $W/cm^2$ should be smaller than the maximum resolution of the optical microscope (about 500 nm).

Second, the bubbles usually prefer to merge to form larger bubbles to minimize the surface energy. In this study, visible large size bubbles were not observed during the whole flow region from inlet to outlet by a high-speed visualization system with 500 nm resolution under various working conditions.

Finally, as illustrated in FIG. 3, the NB flow during convective boiling in the nano-engineered microchannels was annular and the width of the bubble core was growing and flushed out in a periodic manner. These features are fundamentally different from any classic two-phase flow pattern in microfluidic systems and appear to be unified under all operating conditions in this experimental study. As shown in FIG. 3b, the observed two-phase flow pattern presents a periodic annular bubble flow with a frequency ranging from 23.3 to 53.7 Hz and is accompanied by a high frequency rewetting process along inner walls. The vapor quality during tests varies from 0.162 to 0.4. For a given mass flux, the local rewetting frequency increases with effective heat flux because of the intensified nucleate boiling and evaporation (FIG. 3b).

A whole cycle of the reported annular NB flow was recorded. It started from a bubble core in small size at the center of a channel (0 ms in FIG. 3a) since bubbles were firstly separated from the center due to the highest drag force, $F_d$, induced by the highest fluid velocity (in a parabolic velocity profile) in the laminar flow regime. The thickness of the bubble line rapidly grew until it eventually approached the sidewalls of a microchannel (from 0 ms to 7.9 ms in FIG. 3a). This direct contact between the bubble and solid walls instantly activated a rapid rewetting process (10.8 ms) as shown in FIG. 3a as a result of the strong capillary flow induced by the superhydrophilic bi-porous interfaces. Hence, the annular NB flow was separated from sidewalls by capillary liquid flow and consequently, was quickly flushed out of the microchannels (from 20.1 ms to 22.8 ms) as shown in FIG. 3a. The process was then repeated. Even though, the size of bubble core varies, the observation showed that the overall characteristics of the NB flow remained as an identical annular NB flow under various vapor qualities during convective boiling. To further identify the two-phase flow pattern in the nano-engineered microchannels without convective boiling, NBs were generated at the inlet manifold of the microchannel array. The absence of NB coalesce indicated great sustainability as illustrated in FIG. 4. The major difference in the two-phase flow pattern in the nano-engineered microchannels with and without convective boiling is the thickness of the liquid lubrication layer. It was observed the liquid lubrication layer without convective boiling is approximately 70 μm thick, much thicker than approximately 10 μm in the case with convective boiling. In summary, NBs act similar like nanoparticles and the classic two-phase flow patterns can be unified into an annular NB flow.

Figure 5A:
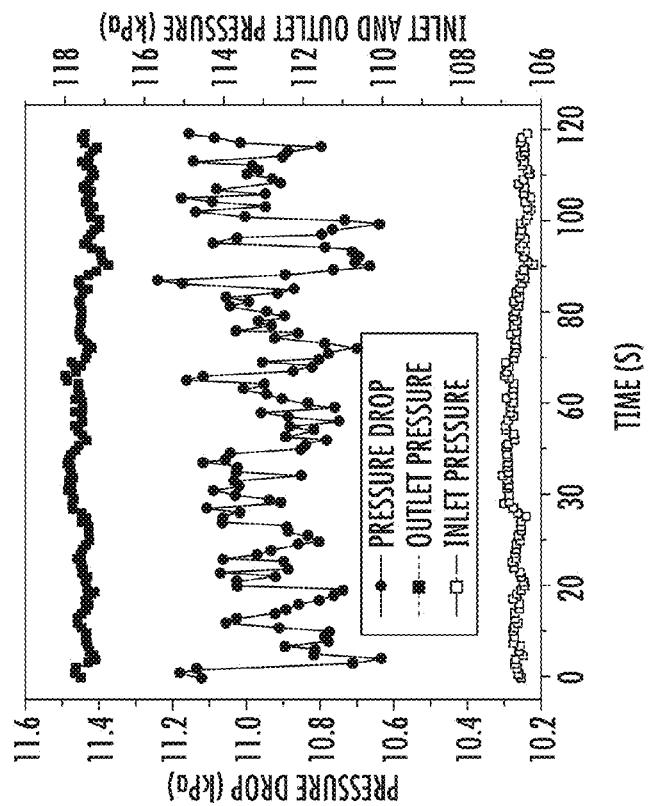
FIG. 5(a) shows a statistic analysis of flow instabilities during the annular vapor NB flow.
Figure 5B:
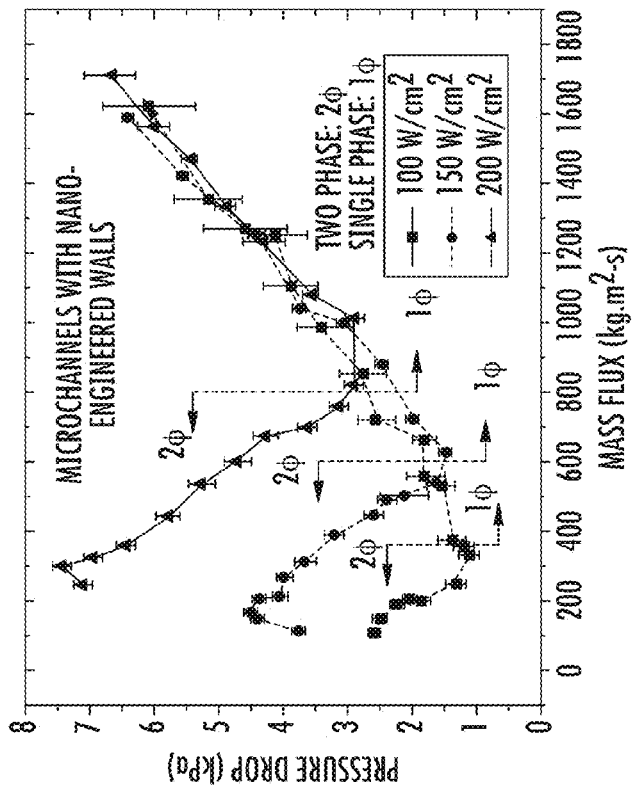
FIG. 5(b) shows the transient pressure and ΔP at G=304 kg/m²·s and $\lambda$=0.283.

Once the diversified flow patterns are unified into a singular flow pattern (i.e., the annular NB flow), two-phase flow in microchannels has been observed to be intrinsically stabilized. In this study, the standard deviation (SD) is adopted to evaluate two-phase flow instabilities by checking the fluctuation of system pressure drop at a given mass flux. As aforementioned, two-phase flow oscillations are usually pronounced in microfluidic systems. The fluctuations of pressure drop in convective boiling in smooth microchannels are characterized as large amplitudes and low frequency. In FIG. 5a, pressure drop and its SDs (represented as the error bars) were illustrated as a function of mass flux under three various input heat fluxes. The SDs in the two-phase regime (left side of dashed lines) show that pressure drop fluctuations in the annular NB flow regime were substantially reduced compared to those in smooth microchannels (FIG. 5a). Also, transient pressure oscillations are plotted in FIG. 5b. The stability analysis indicated that the two-phase flow can be stabilized through the generation of stable and isolated vapor NBs and shows better stabilities at high input heat fluxes.

Discussion

The interface plays critical roles in generating stable and isolated vapor NBs and forming the annular NB flow. Specifically, this interface with optimized opening size serves as active nucleation cavities to generate vapor NBs and is also effective in transforming the dominant surface tension force, and consequently, creating capillary flow along inner walls in a microchannel. When bubbles are smaller than approximately 5 μm in diameter, the buoyant force disappears. As a result, the bubble separation process (that is, bubble departure) is primarily governed by the anchoring surface tension force ($F_s=2\pi R_c \sigma \sin \theta$) and the lifting drag force ($F_d=\rho_l V^2 C_D \pi R^2/2$), where R is the bubble radius, $R_c$ is the cavity opening radius, V is the bulk fluid velocity, θ is the static contact angle, σ is the surface tension, $\rho_l$ is the liquid density, and $C_D$ is the drag coefficient. The bubble growth force resulting from evaporation plays important roles in determining vapor bubble separation and motions. However, existing models to estimate the growth force are based on regular-sized bubbles and are thus not applicable on NBs. According to a force analysis, to generate isolated NBs, the cavity opening radius, $R_c$, and contact angle, θ, shall be minimized to reduce the anchoring surface tension force, while sufficient drag force, $F_d$, shall be imposed by convection. According to nucleate boiling theory, the range of active cavity opening radius, $R_c$, shall be from approximately 200 to 700 nm, which is carefully realized in this study by controlling the silicon nanowire height as shown in FIGS. 1c and 1d through nanocarpet effect. It is imperative to treat all wetted areas in order to prevent bubble coalesces by preventing growth of large-sized bubbles, and hence, to achieve a full manipulation of bubble flow by transforming the dominant surface tension force from the cross-section plane to inner-wall plane in microfluidic systems.

The mechanisms behind the unified two-phase flow pattern are discussed in this section. As described in above sections, large bubble slugs were not observed as shown in FIG. 1a during the whole experimental study. It indicated that the bubble coalescences are not prevalent and vapor NBs are therefore isolated and stable. The primary reason could be similar with existence of superstable gas NBs, i.e., low gas diffusivity due to hard hydrogen bond and an electric double layer repulsion between the surfaces of adjacent bubbles. This observation will extend the understanding of superstable NBs. Equally important, the surface tension force has been thoroughly transformed from the cross-section plane to the inner-wall plane. The average surface tension pressure induced by the superhydrophilic bi-porous interfaces is approximately $10^5$ Pa, which is at least two orders of magnitude higher than that generated in the cross-sectional plane in microchannels (that is, approximately 600 Pa). The surface tension force induced on walls is dominant and hence can induce strong local capillary liquid flows along the inner solid walls, which has been well evinced by the absence of liquid slugs (schematically and experimentally illustrated in FIGS. 2a to 2b, FIG. 3a and FIG. 4, respectively) and the high frequency rewetting processes (FIG. 3a). Additionally, as shown in FIGS. 3c and 3d, the highest rewetting velocity reaches 1.6 m/s in this study. The averaged rewetting velocity is approximately 0.73 m/s, which is substantially higher than the average bulk fluid velocity at the inlet (0.304 m/s) and further indicated the existence of the capillary flows on nano-engineered walls. Once the liquid thoroughly spreads over the walls, the lubrication layers were fully established. The bubbles were therefore rapidly flushed out at a speed of 6.5 m/s due to the reduction of friction resulting from bubble boundary layers.

In summary, the nano-engineered superhydrophilic bi-porous interfaces were carefully designed and have been experimentally demonstrated in generating large amount of stable and isolated vapor NBs, and hence, unifying the diversified two-phase flow patterns in microfluidic systems. The intrinsic merits of a unified two-phase flow pattern are highly desired by all areas pertinent to microscale two-phase transport.

Methods

Micro/Nanofabrication:

Experimental study has been carried out in a MEMS testing chip (FIGS. 1 and 6). This device was fabricated by microfabrication processes (refer supplementary materials) on a silicon wafer. Microchannel (200 μm×250 μm×10 mm) arrays were fabricated by deep reactive-ion etching (DRIE) and were covered with a Pyrex glass wafer as an observation window. Superhydrophilic bi-porous interfaces were formed in hydrofluoric acid with Ag+ nanoparticles (AgNPs) catalyst. These AgNPs were deposited onto the three inner microchannel walls. An aluminum thin-film heater (2 mm×10 mm) was integrated on the backside of the chip to generate vapor NBs in the microchannels and to measure input power.

Microscopy:

SEM figures were taken by using a Zeiss Ultraplus thermal field emission SEM with a resolution of 0.8 nm. A customized visualization system, which consists of a Phantom V 7.3 high speed camera and an Olympus BX51 M optical microscope, has been used to capture two-phase transport phenomena at submicron scale.

Uncertainty Analysis:

Two pressure transducers measured the inlet and outlet pressures, respectively. Pressure drop data was collected by Omega PX01-C1 pressure transducer with ±0.05% linearity and repeatability. Mass fluxes were measured by Sensiron ASL1600 flowmeter with 0.03 kg/cm$^2$·s resolution. All zero points of transducer output were calibrated under 1 atmosphere before measurements. Bubble sizes were measured by digital images. Each pixel in digital image could be as small as 250 nm. The error of bubble size should be ±125 nm. The local flow velocities and rewetting frequencies were measured by high speed video. The uncertainty of time, which equals to or less than 1/3000 second (3000 is the number of frames per second). Data reduction and detailed fabrication processes are included in supplemental materials.

Example 2

Nanoengineered bi-porous interfaces were developed and integrated in the inner surfaces of microchannels to successfully realize sophisticated control of bubble growth, separations, interactions and two-phase flows. Ultrahigh density isolated vapor nanobubbles have been successfully generated on the novel nano-engineered interfaces by reducing the bubble departure diameter down to nanoscale. The flow boiling with a new and unified annular nanobubble flow pattern has been observed to be self-stabilized and ultra-efficient in the heat transfer rate with a significant reduction of pressure drop. Moreover, critical heat flux (CHF) has been substantially improved. Specifically, heat transfer coefficient and CHF were enhanced up to 267% and 277% with approximately 50% reduction in the pressure drop at a moderate mass flux of 303 kg/m$^2$·s compared with microchannels with smooth walls.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A method of forming a microfluidic device from a wafer, wherein the wafer defines a first surface opposite from a second surface, the method comprising:
    depositing an oxide layer on the first surface;
    forming a microchannel in the first surface of the wafer, wherein the microchannel is defined between a pair of side walls and a bottom surface;
    depositing a layer of Ag$^+$ nanoparticles on each side wall and the bottom surface; and
    forming a plurality of nanowires extending from each side wall and the bottom surface;
    forming a nanostructured interface comprising micropores surrounded by nanoscale pores; and
    oxidizing the nanowires wherein the oxidized nanowires exhibit superhydrophilicity;
    wherein neighboring nanowires form bundles such that the micropores of the nanostructured interface are formed from the bundles, and the nanoscale pores of the nanostructured interface are created by isolated nanowires.

2. The method as in claim 1, wherein the plurality of nanowires are formed in hydrofluoric acid with the Ag$^+$ nanoparticles present as a catalyst.

3. The method as in claim 1, wherein the wafer is a silicon wafer.

4. The method as in claim 1, wherein the oxide layer comprises a silicon oxide.

5. The method as in claim 4, wherein the nanowires comprise silicon.

6. The method as in claim 5, wherein the nanowires comprise pure silicon.

7. The method as in claim 5, wherein the nanowires comprise silicon oxide.

8. The method as in claim 5, wherein the nanowires comprise silicon carbide.

9. The method as in claim 1, wherein the nanowires are metallic nanowires.

10. The method as in claim 9, wherein the metallic nanowires comprise Ni, Pt, Au, or mixtures thereof.

11. The method as in claim 1, wherein the nanowires are semiconducting nanowires.

12. The method as in claim 11, wherein the semiconducting nanowires comprise Si, InP, GaN, SiC, or mixtures thereof.

13. The method as in claim 1, wherein the nanowires are insulating nanowires.

14. The method as in claim 13, wherein the insulating nanowires comprise SiO$_2$, TiO$_2$, or mixtures thereof.

15. The method as in claim 1, wherein the nanowires are carbon nanowires.

16. The method as in claim 1, wherein the nanowires extending from each of the side walls have tilt angle of about 30° to about 60° in relation to the bottom surface.

17. The method as in claim 1, wherein the microchannel is substantially rectangular in its cross-section, such that each of the side walls is substantially perpendicular to the bottom surface.

18. The method as in claim 1, wherein the microchannel has a depth of about 50 μm to about 1000 μm.

19. The method as in claim 1, wherein the nanowires extend a length of about 750 nm to about 20 μm, and wherein the nanowires have a diameter of about 5 nm to about 50 nm.

* * * * *

UNITED STATES PATENT AND TRADEMARK OFFICE
CERTIFICATE OF CORRECTION

PATENT NO. : 9,833,780 B2  
APPLICATION NO. : 14/830059  
DATED : December 5, 2017  
INVENTOR(S) : Chen Li et al.

Page 1 of 1

It is certified that error appears in the above-identified patent and that said Letters Patent is hereby corrected as shown below:

On the Title Page

Under Item (62) Related U.S. Application Data:
"..., filed on Mar. 4, 2013"

Should read:
"filed on Mar. 14, 2013"

Page 2, Column 1, Line 3, under item (60) Related U.S. Application Data:
"Provisional application No. 61/742,008, filed on Mar. 1, 2012,
provisional application No. 61/742,007, filed on Mar. 1, 2012."

Should read:
"Provisional application No. 61/742,008, filed on Aug. 1, 2012,
provisional application No. 61/742,007, filed on Aug. 1, 2012."

Signed and Sealed this  
Twenty-fourth Day of May, 2022

Katherine Kelly Vidal  
*Director of the United States Patent and Trademark Office*